United States Patent
Kumar et al.

(10) Patent No.: US 10,522,214 B2
(45) Date of Patent: Dec. 31, 2019

(54) ROBUST NEGATIVE BIT-LINE AND RELIABILITY AWARE WRITE ASSIST

(71) Applicant: Synopsys, Inc., Mountain View, CA (US)

(72) Inventors: Sudhir Kumar, New Delhi (IN); Vinay Kumar, Aligarh (IN); Sumit Srivastava, Benares (IN); Nikhil Puri, Nawanshahr (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/617,789

(22) Filed: Jun. 8, 2017

(65) Prior Publication Data

US 2017/0358345 A1    Dec. 14, 2017

Related U.S. Application Data

(60) Provisional application No. 62/348,138, filed on Jun. 9, 2016.

(51) Int. Cl.
G11C 11/419    (2006.01)
G11C 5/14      (2006.01)
G11C 7/12      (2006.01)

(52) U.S. Cl.
CPC ............ *G11C 11/419* (2013.01); *G11C 5/146* (2013.01); *G11C 5/147* (2013.01); *G11C 7/12* (2013.01)

(58) Field of Classification Search
CPC ....... G11C 11/419; G11C 5/146; G11C 5/147; G11C 7/12
USPC ......................................................... 365/154
See application file for complete search history.

(56) References Cited

U.S. PATENT DOCUMENTS

| | | | | |
|---|---|---|---|---|
| 8,331,132 B2 * | 12/2012 | Cheng | ...................... | G11C 7/20 365/149 |
| 8,363,453 B2 | 1/2013 | Arsovski et al. | | |
| 8,441,874 B2 | 5/2013 | Sinha et al. | | |
| 8,837,229 B1 * | 9/2014 | Dubey | .................. | G11C 11/417 365/189.02 |
| 9,508,420 B1 * | 11/2016 | Hunt-Schroeder | ......................... | G11C 11/419 |
| 9,570,156 B1 * | 2/2017 | Braceras | ................ | G11C 11/419 |
| 2009/0235171 A1 * | 9/2009 | Adams | .................. | G11C 7/1096 715/723 |
| 2010/0182865 A1 * | 7/2010 | Wu | ........................ | G11C 5/145 365/226 |
| 2010/0188909 A1 * | 7/2010 | Kenkare | ............... | G11C 11/419 365/189.16 |
| 2012/0170391 A1 * | 7/2012 | Janardan | .................. | G11C 7/04 365/194 |

(Continued)

OTHER PUBLICATIONS

Burnett et al., FinFET SRAM Design Challenges, 2014 IEEE International Conference on IC Design & Technology, May 2014 (4 pages).

(Continued)

*Primary Examiner* — Sung Il Cho
(74) *Attorney, Agent, or Firm* — HIPLegal LLP; Judith Szepesi

(57) ABSTRACT

A reliability aware negative bit-line write assist (RA-NBL) circuit comprises a coupling capacitor to provide a negative bump for write assist, and a control input generator control charging of the coupling capacitor, such that the negative bump is high at a low voltage, and the negative bump is low at a high voltage.

20 Claims, 9 Drawing Sheets

(56) References Cited

U.S. PATENT DOCUMENTS

| | | | |
|---|---|---|---|
| 2013/0176796 A1* | 7/2013 | Tanabe | G11C 7/00 365/189.011 |
| 2013/0286717 A1* | 10/2013 | Adams | G11C 11/419 365/154 |
| 2014/0160871 A1* | 6/2014 | Zimmer | G11C 11/419 365/189.16 |
| 2015/0131364 A1* | 5/2015 | Hsieh | G11C 7/12 365/154 |
| 2015/0131366 A1* | 5/2015 | Wu | G11C 11/419 365/154 |
| 2015/0146479 A1* | 5/2015 | Pilo | G11C 11/419 365/156 |
| 2015/0170721 A1* | 6/2015 | Dubey | G11C 7/12 365/189.16 |
| 2015/0206577 A1* | 7/2015 | Gong | G11C 11/419 365/154 |
| 2015/0228312 A1* | 8/2015 | Bhatia | G06F 1/3203 365/227 |
| 2015/0279454 A1* | 10/2015 | Sano | G11C 7/12 365/189.09 |
| 2016/0042784 A1* | 2/2016 | Rim | G11C 11/419 365/154 |
| 2016/0203857 A1* | 7/2016 | Chandra | G11C 11/419 365/156 |
| 2017/0004874 A1* | 1/2017 | Braceras | G11C 11/419 |
| 2017/0011793 A1* | 1/2017 | Shamanna | G11C 7/22 |
| 2017/0117034 A1* | 4/2017 | Hebig | G11C 11/419 |
| 2017/0206961 A1* | 7/2017 | Yoon | G06F 3/061 |
| 2017/0270999 A1* | 9/2017 | Hunt-Schroeder | G11C 11/419 |
| 2017/0287554 A1* | 10/2017 | Yabuuchi | G11C 11/419 |
| 2017/0294223 A1* | 10/2017 | Zhang | G11C 11/419 |

OTHER PUBLICATIONS

Chen et al, A 16 nm 128 Mb SRAM in High—Metal-Gate FinFET Technology With Write-Assist Circuitry for Low-VMIN Applications, IEEE Journal of Solid-State Circuits, vol. 50, No. 1, Jan. 2015 (8 pages).

Chiu et al., Analysis of the Reliability Impact on High-k Metal Gate SRAM with Assist-Circuit, Conference: 2014 IEEE International Reliability Physics Symposium (IRPS), Jun. 2014 (4 pages).

Dhori, et al., Write Assist Circuit to Cater Reliability and Floating Bit Line Problem of Negative Bit Line Assist Technique for Single or Multiport Static Random Access Memory, IEEE Transactions on Very Large Scale Integration (VLSI) Systems, vol. 22, No. 11, Nov. 2014 (7 pages).

Song et al., A 14 nm FinFET 128 Mb SRAM With V Enhancement Techniques for Low-Power Applications, IEEE Journal of Solid-State Circuits, vol. 50, No. 1, Jan. 15 (12 pages).

T.W. Her, Pin Assignment with Timing Consideration. Circuits and Systems, 1996 IEEE International Symposium, 1996 (4 pages).

Tanaka et al., A 512-kb 1-GHz 28-nm Partially Write-Assisted Dual-Port SRAM with Self-Adjustable Negative Bias Bitline, 2014 Symposium on VLSI Circuits Digest of Technical Papers, Jun. 2014 (2 pages).

* cited by examiner

| Supply Voltage(V) | Negative Voltage Requirement (% Supply Voltage) | |
|---|---|---|
| | Temp 125C | Temp -40C |
| 0.500 | -25% | -40% |
| 0.550 | -20% | -30% |
| 0.600 | -15% | -25% |
| 0.650 | -5% | -15% |
| 0.700 | 0% | -10% |
| 0.750 | 2% | -8% |

Figure 4A

| Supply voltage (V) | Negative voltage generated (%Supply) by RA-NBL System | |
|---|---|---|
| | Temp 125C | Temp -40C |
| 0.50 | 30% | 61% |
| 0.55 | 27% | 59% |
| 0.60 | 21% | 58% |
| 0.65 | 15% | 55% |
| 0.70 | 13% | 47% |
| 0.75 | 11% | 28% |
| 0.80 | 7% | 20% |

Figure 4B

ROBUST NEGATIVE BIT-LINE AND RELIABILITY AWARE WRITE ASSIST

RELATED APPLICATIONS

The present application claims priority to U.S. Provisional Patent Application No. 62/348,138 filed Jun. 9, 2017, and incorporates that application in its entirety.

FIELD OF THE INVENTION

The present invention is related to write assist, and in particular write assists in ultra-low power applications.

BACKGROUND

Memory devices are used as storage for digital data in a lot of electronic integrated circuits (ICs), for example in computers, processors, microcontrollers etc. One basic type of a memory device is Random Access Memory (RAM) which is of two types: static RAM (SRAM) and dynamic RAM (DRAM). In a SRAM memory an array of cells is used to store data and each cell can store one bit of data i.e. "0" or "1". A typical SRAM consists of a pair of cross-coupled inverters which form a latch to store the data. Data to be written into this cell is driven from the bit lines which are connected to these cross-coupled inverters via pass gates which are typically N-type Metal Oxide Semiconductor Field Effect Transistor (MOSFET) devices (NMOS).

For a successful write operation, the data on the bitlines should be strong enough to overpower the cross-coupled inverter latch to write the new data on the cell. In part because of their uses in biomedical and Internet-of-Things (IOT) applications, the supply voltage of such devices has been scaled down. As a direct result of this scaling down of the supply voltage, the writeability of the SRAM cell has deteriorated. As the technology is shrinking there are significant concerns about power dissipation and leakage of memory devices as well.

Various methods of implement write assist (WA) circuits have been proposed to improve the write performance of SRAM cells. The most widely used method is the negative bitline write assist technique. In this technique, the bitline through which "0" is being written is driven below the reference ground voltage to strengthen the pass gates by increasing its source-gate voltage.

In the prior art technique, a negative voltage bump is generated on the bitline by using coupling capacitor. The bump is directly proportional to the size of capacitor and supply voltage. To achieve successful low voltage write operation a large capacitor is required. However, using a large capacitor means a larger negative bump at higher supply voltages, when no negative bump is needed. Having the larger negative bump a causes severe reliability and aging issue to the SRAM cell. This overstressing may lead to oxide breakdown of the NMOS pass gate and cause a loss of yield of SRAM cell. The reliability concern has a huge impact on fabrication costs as well as the lifespan of the memory device and consequently the whole electronic system on chip (SoC). Also, a large negative bump can create data retention issues in unselected SRAM cells where pass gates can be turned on due to increased gate-source voltage. These issues are especially apparent when the SRAM cell operates in ultra-low voltage applications (IoT, wireless and biomedical application).

BRIEF DESCRIPTION OF THE FIGURES

The present invention is illustrated by way of example, and not by way of limitation, in the figures of the accompanying drawings and in which like reference numerals refer to similar elements and in which:

FIG. 4A is a table of bitcell characteristics at various temperatures and voltage levels.

FIG. 4B is a table of exemplary negative bump values generated by the RA0NBL circuit.

DETAILED DESCRIPTION

Figure 1:
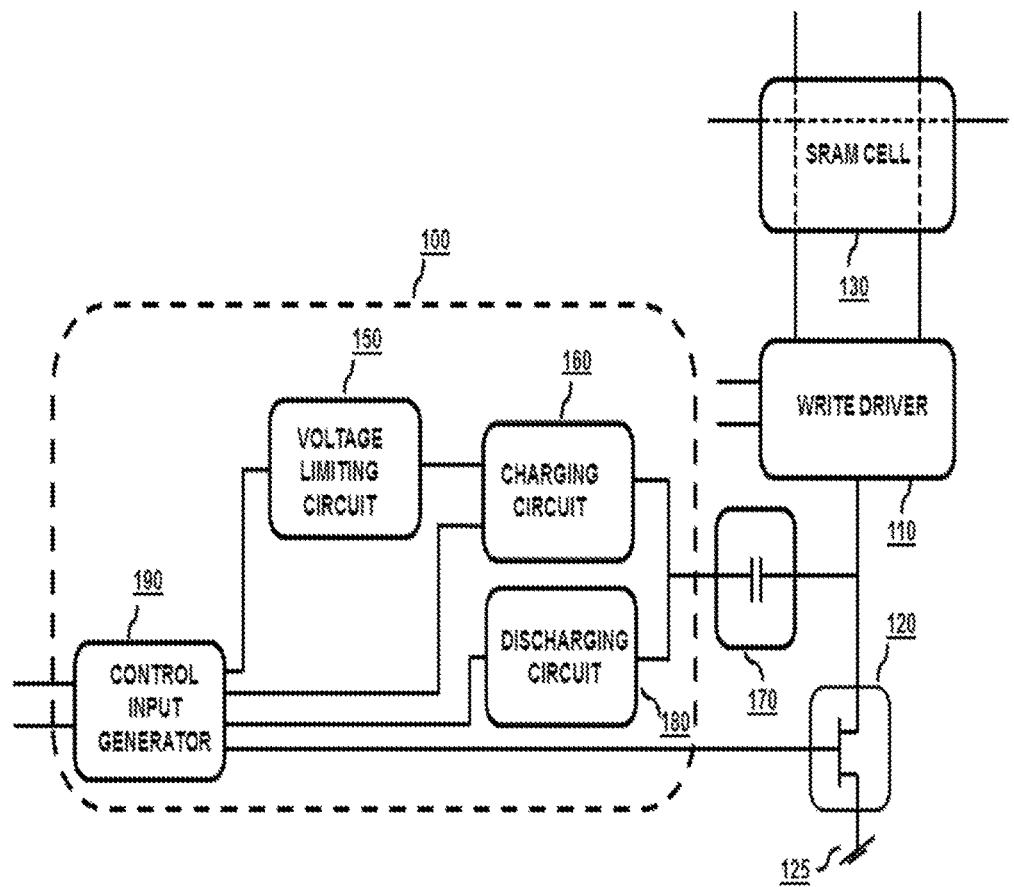
FIG. 1 is a block level representation of one embodiment of a Reliability Aware-Negative Bit-line Write Assist scheme (RA-NBL) circuit.

A memory device can be operated in a wide range of voltages. To write data in SRAM memory, the write assist circuit is useful in the low voltage and low temperature domain but there is no need of any assist circuit when operating in high voltage and high temperature domain. Furthermore, having a write assist when not needed can lead to degradation of the memory. To provide a selective write assist, the write assist circuit needs to be switched on and off based on the operating voltage externally. This is especially useful in System on chip (SoC) environments.

The present system is a Reliability Aware-Negative Bit-line Write Assist (RA-NBL) circuit. The RA-NBL circuit, in one embodiment, permits the write assist circuit to operate seamlessly from low to high voltage without the need to manage an additional pin for controlling the negative bump. This control is provided by generating a tuned negative bias that is close to the expected write assist requirement for SRAM across a wide operating voltage range. By enabling a large negative bump at lower supply voltage, without overstressing the device at higher supply voltage, the system enables a wide range of voltages to be used. This allows memory to meet the specification of ultra-low voltage applications which is very important in terms of the market requirement today for IoT, biomedical technologies and wireless sensor applications.

The problem of reliability and aging is also highly sensitive to temperature. The RA-NBL circuit, in one embodiment, aims to resolve this by reducing negative bump at higher temperatures to relax the SRAM stress condition. This improves the ageing and yield of the SRAM. In one embodiment, the RA-NBL circuit also controls the negative bump value at mid- to high operating voltages improving the overall performance compared to having no write assist circuit.

The system has different negative voltage bumps at high and low temperatures. While the discussion references "high" temperature and "low" temperature, the actual adjustment is continuous between various temperatures. In one embodiment, high temperature is in the range of 125 C, while low temperature is −40 C. In one embodiment, operating temperatures above room temperature are considered high temperature, while operating temperatures below room temperature are considered low temperature. In another embodiment, there is a third temperature range of "normal temperature," where the temperature ranges are high (80 C to 125 C), normal (80 C to 0 C) and low (0 C to −40 C). Other divisions of temperature may be used. In one embodiment, the voltage range may be from 1V to 0.5V.

FIG. 4A shows a table illustrating bitcell characteristics, showing the negative bump needed for a successful write operation for the worst process corner (slow NMOS, fast PMOS). The table illustrates exemplary negative bumps needed for a high density bitcell 7 nm technology. As can be seen, at a high voltage, and high temperature (125 C), no bump is used above 0.7V, and a −25% bump is used at 0.5V. At a low temperature (40 C) the negative bump at 0.5V is −40°% while at 0.75V it's −8% only. Above 0.75V, no bump is needed at either temperature. The RA-NBL circuit is designed, in one embodiment, to provide a larger negative voltage bump than the bitcell characteristics illustrated in FIG. 3A. The RA-NBL circuit, in one embodiment, also resolves the data retention issue faced by unselected cells by maintaining a low gate-source voltage on the pass gates across the entire operative voltage range of memory.

The RA-NBL circuit is designed to improve the writeability of a SRAM bitcell by adding a negative bias to the bitline for low voltage, without stressing the devices at high voltage. In one embodiment, the circuit consists of a coupling capacitor for generating the negative bias. In one embodiment, the control block consists of a circuit which charges the coupling capacitor to a certain voltage and then discharges it during the write operation. In one embodiment, the block consists of a NMOS transistor connected in a gate-drain terminal connected configuration to control the charging of the capacitor. The gate-drain connected NMOS, or diode-connected device, acts as a voltage limiter, which is voltage and temperature dependent.

One of the skill in the art is well aware of the several write assist techniques circuits are available in the literature, including VDD lowering of SRAM cell, VSS raising of SRAM cell, Word-line boosting and Negative Bit-line write assist technique. The negative bit-line scheme has been a widely used solution. The negative bit-line scheme creates a negative bump for write assist, which helps to achieve a negative bias voltage on the SRAM's bit-lines. Therefore, in this context a "higher" negative bump is a larger amplitude, e.g. a lower voltage.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

FIG. 1 is a block diagram of one embodiment of the RA-NBL circuit. In one embodiment, the RA-NBL circuit 100, is coupled between a write driver 110, and a switch 120 to ground 125. The write driver 110 controls writing in the SRAM cell 130. The RA-NBL circuit 100 in one embodiment has the following components: a voltage limiting circuit 150, a charging circuit 160, a coupling capacitor 170, a discharging circuit 180, and a control input generator 190.

The charging circuit 160 charges coupling capacitor 170, which provides the negative bump. Charging circuit 160 is controlled by voltage limiting circuit 150. In one embodiment, the voltage limiting circuit 150 controls the gate drive of charging circuit 160, and acts as voltage limiting device. The coupling capacitor 170 is charged by charging circuit 160, and is pulled down to VSS (ground) through discharging circuit 180. The sequence of charging the coupling capacitor 170 and its discharging is controlled by control input generator 190. Control input generator 190 also controls switch 120, which in turn provides input to write driver 110.

The RA-NBL circuit generates a negative voltage through a coupling capacitor 170 in a tunable manner so that the maximum negative voltage is generated at low voltage and temperatures.

In one embodiment, RA-NBL circuit 100 including coupling capacitor 170 may be shared across multiple columns of an SRAM array.

Figure 6:
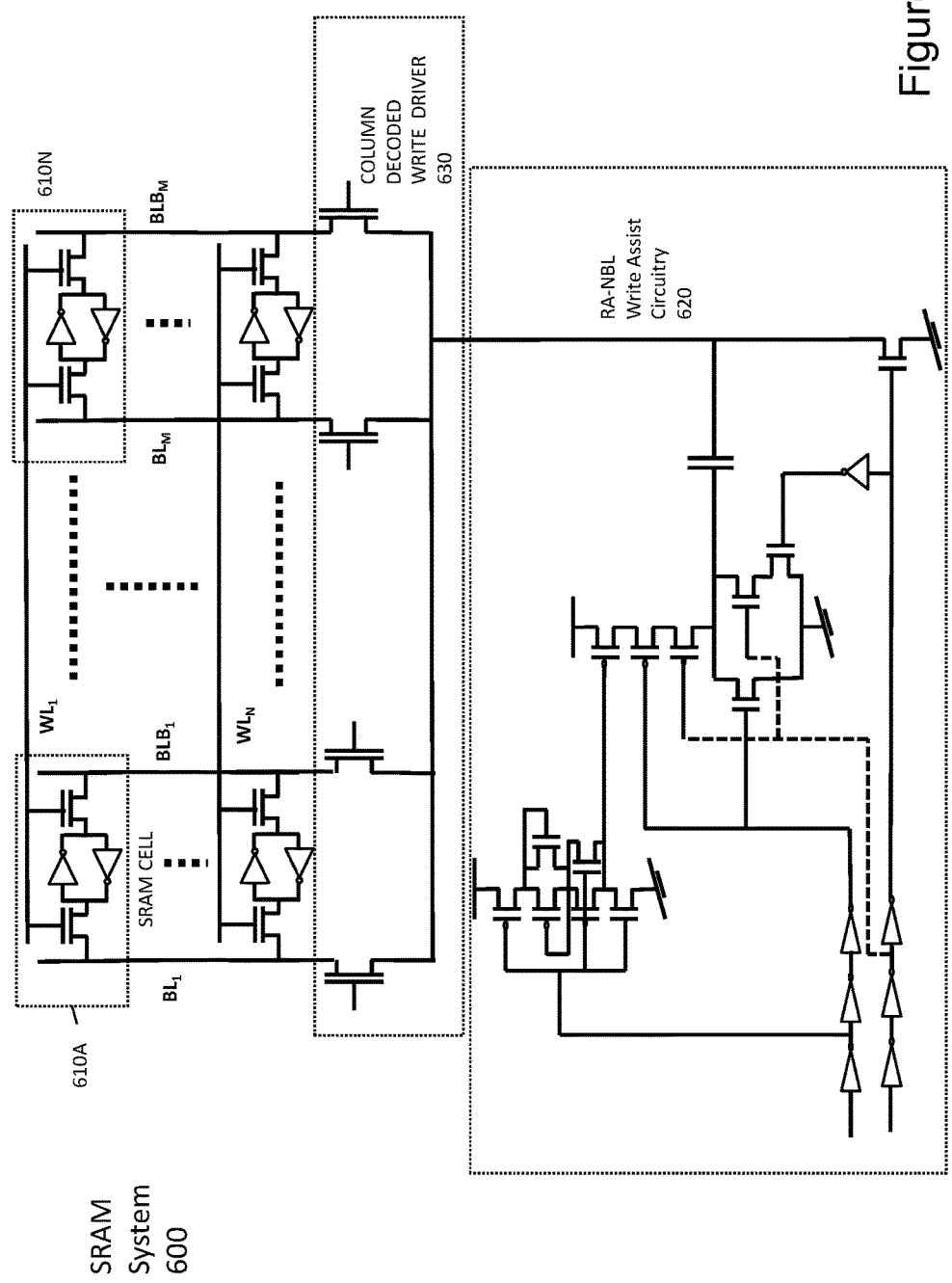
FIG. 6 is a block diagram of one embodiment of an SRAM circuit including the RA-NBL circuit.

FIG. 6 illustrates one embodiment of an SRAM system including the RA-NBL circuit. SRAM system 600 includes a plurality of SRAM cells 610A-610N, and an RA-NBL circuit 620. As can be seen, in one embodiment, an RA-NBL circuit 620 is shared between a plurality of SRAM cells 610A-610N. SRAM cells 610A-610N are in proximity, and thus are likely to experience the same voltage and temperature levels. In one embodiment between 32 and 1024 SRAM cells may be coupled to an RA-NBL circuit 620. In one embodiment, a typical configuration may include 512 SRAM cells coupled to the RA-NBL circuit 620. In one embodiment, the coupling capacitor size depends on the bitline capacitance per SRAM cell and the number of SRAM cells across which the RA-NBL circuit is shared multiplied by a constant, which depends on the technology parameters and negative voltage requirement.

Figure 2:
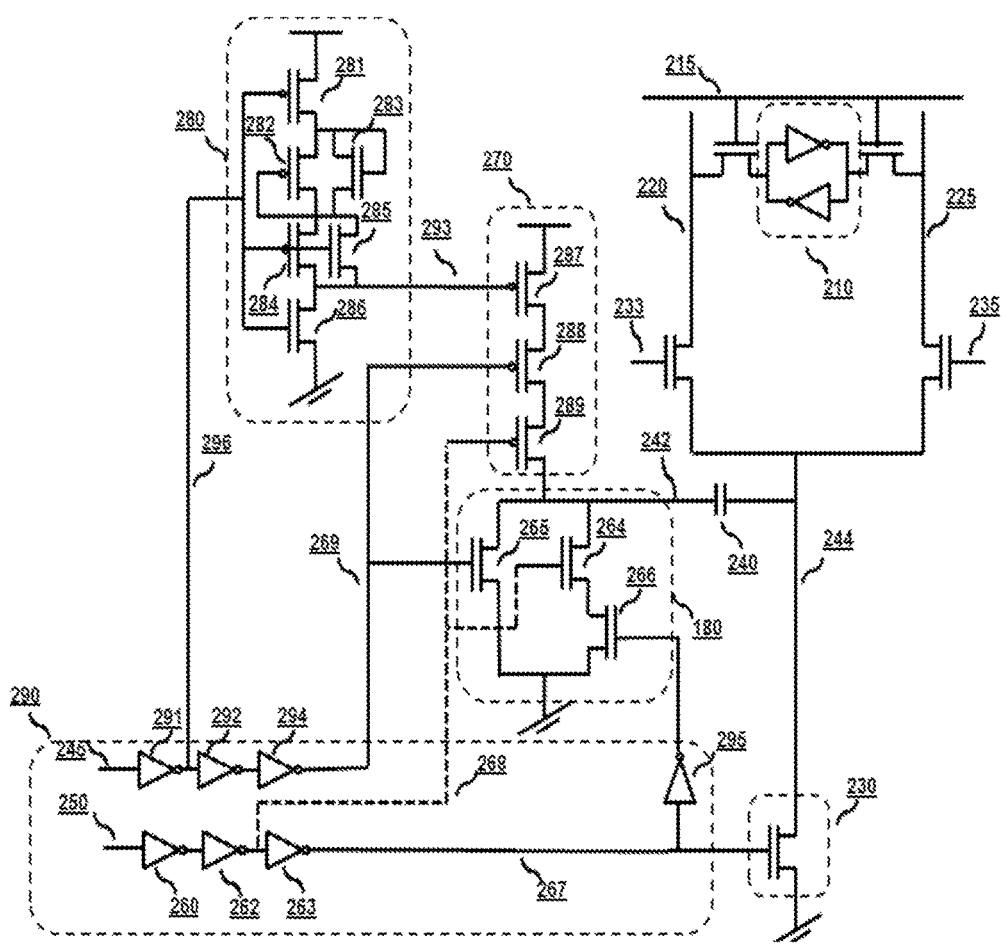
FIG. 2 is a circuit level representation of one embodiment of a Reliability Aware-Negative Bit-line Write Assist scheme (RA-NBL) circuit.

FIG. 2 is a circuit diagram of one embodiment of the RA-NBL circuit 100. Here is an example of single port SRAM cell 210 is shown as one embodiment of the circuit. However, one of skill in art can understand that similar memory devices and operations can implement multi-port memory cells. The SRAM cell 210 can store one bit of logical data. Write line 215 can be enabled to connect SRAM cell 210 to the bit lines 220 and 225 through which data to be written in the memory cell is driven. While only one memory cell is shown in the memory device, one of skill in the art would understand that memory devices have many memory cells arranged in various configurations, and that a single RA-NBL circuit can drive a plurality of memory cells, in one embodiment. In one embodiment, the memory system also consists of write driver circuit 230 which is coupled to the memory cell through the bit lines 220 and 225.

Data to be written is controlled by signal 233 and 235, enabling the NMOS in write driver circuit 230. The memory system in one embodiment includes coupling capacitance circuit 240 to provide the negative voltage to either of bit line 220 and 225 via the write driver circuit 230.

In the static condition, both nodes 242 and 244 of capacitor 240 are at GND. Write assist operation has two phases. The high rising signal 245 starts the first phase of write assist operation. During the first phase, the node 242 of coupling capacitor 240 is charged to provide negative voltage. The second phase of write Assist operation is initiated by rising edge of signal 250. When signal 250 rises, it turns OFF charging of coupling capacitor 240 by turning OFF PMOS 289. In one embodiment, this occurs after a delay. In one embodiment, the delay is caused by programmable inverters 260 and 262. Delayed version of signal 250 turns off write driver circuit 230 (NMOS) that provides GND path to either of bit-line 220 and 225. Once writer driver circuit 230 turns OFF, the coupling capacitance of capacitor 240 discharges to GND through NMOS devices 264 and 266. Thus, negative voltage is generated through the coupling capacitor 240 and this negative voltage is transfer to either bit-line 220 and 225 depending ON and OFF state of NMOS 264 and 266.

To align negative voltage generation with reliability, optimally the coupling capacitor 240 is fully charged at low voltage, but charged minimally or not at all at high voltage, This is achieved, in one embodiment, by voltage limiting circuitry 280. In one embodiment, voltage limiting circuitry 280 includes circuitry which limits the charging voltage for the capacitor 240 based on the voltage level (Vdd) and based on the temperature level. Voltage limiting component 280 cuts off the charging path of the coupling capacitor 240 at high voltage and/or temperature, to ensure a minimum negative voltage is generated. High voltage and high temperature is also referred to as "stress condition," because it causes stress on the SRAM memory.

In one embodiment, the voltage limiting circuit 280 includes a gate-drain connected PMOS transistor 282 with gate-drain connected NMOS transistor 283. The difference between the supply voltage and threshold voltage of the PMOS transistor 282 and NMOS transistor 283 determines the amount of the current flowing though PMOS 284. This difference is larger at higher voltages and/or higher temperatures.

FIG. 4B illustrates a table of one embodiment of the negative voltage bump that may be provided by the RA-NBL circuit. In one embodiment, the voltage limiting circuit 280 provides a negative bump that is larger than the negative bump needed by even the worst process corner at the designated voltage and temperature levels, as shown in FIG. 4A.

In an alternate embodiment, a PMOS transistor 282 may be used. Using a combination of the PMOS transistor 282 and the NMOS transistor 283 reduces the impact of process variation. The combined PMOS 282 and NMOS 283 provide process compensation across all corners. However, the PMOS transistor 282 without NMOS transistor 283 is also functional, and may be used in one embodiment.

The gate of the PMOS 287 of the charging circuit 270 charges node 242 through PMOS 287, PMOS 288, and PMOS 289. In one embodiment, PMOS 287, 288, 289 are coupled in series to a finite pulse width controlled by control input generator 290. In one embodiment, the finite pulse is controlled by a programmable inverter chain 292 and 294. The gate drive of PMOS 287 will depend on the signal at node 293 from voltage limiting circuit 280. The gates of PMOS 288 and PMOS 289 are controlled by node 269 and 268 respectively, which are outputs from the programmable inverter chain 292 and 294.

In one embodiment, node 293 is initialized to low supply rail at the beginning of the write cycle for the memory device. The voltage level at node 293 depends on the voltage limiting circuit 280 that is voltage and temperature dependent. Gate signal at node 293 of PMOS 287 of the charging circuit 270 remains at VSS during the charging period of coupling capacitor 240 at low voltage as shown in FIG. 3A, while at high voltage gate signal at node 293 of PMOS 287 charges quickly to higher value that charges coupling capacitor 240 through weakly on PMOS 287 during charging time as shown FIG. 3B.

Figure 3A:
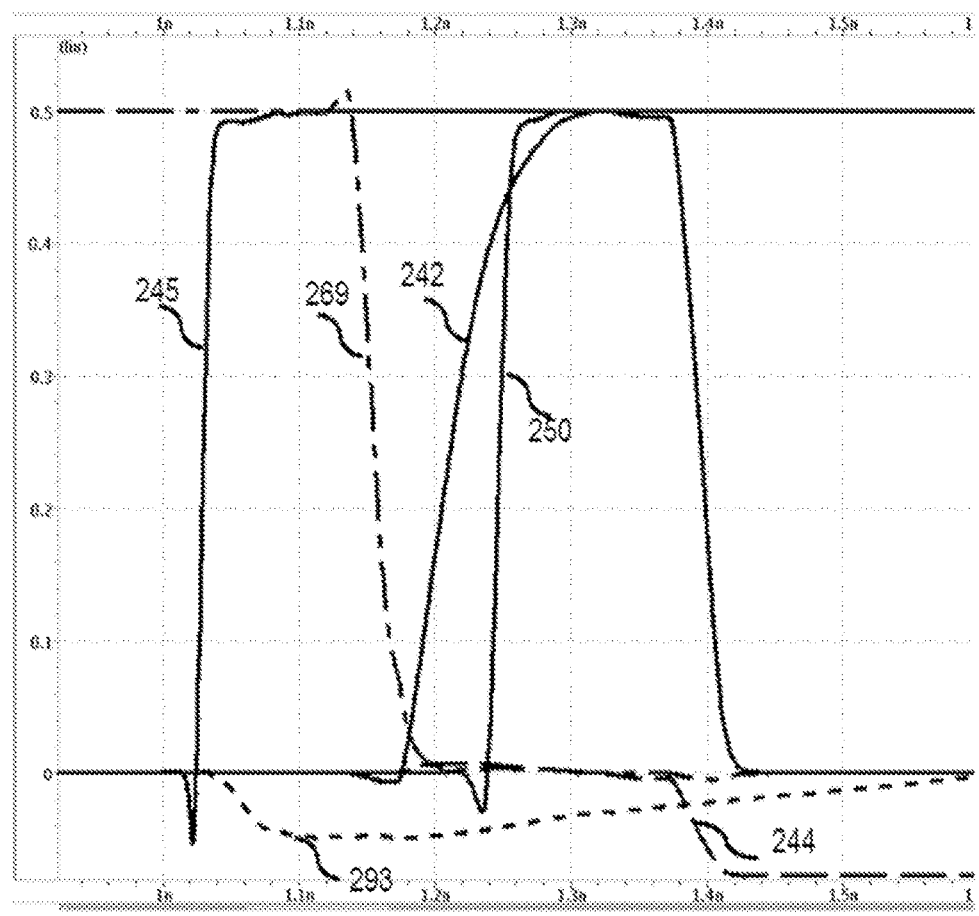
FIG. 3A is an exemplary waveform at low voltage and low temperature, using the RA-NBL circuit.

As shown in FIG. 3A, node 242 of coupling capacitor 240 is charged to full level that generates high negative voltage at low voltage and low temperature. In one embodiment, the high negative voltage is ~−80 mV. This high negative voltage bump charges the coupling capacitor 240. This negative voltage bump at node 244 transfers to bit lines 220, 225 through NMOSs 233, 235. In one embodiment, the maximum negative voltage is 60 mV to 100 mV. In one embodiment, the high negative voltage is approximately 80 mV.

Figure 3B:
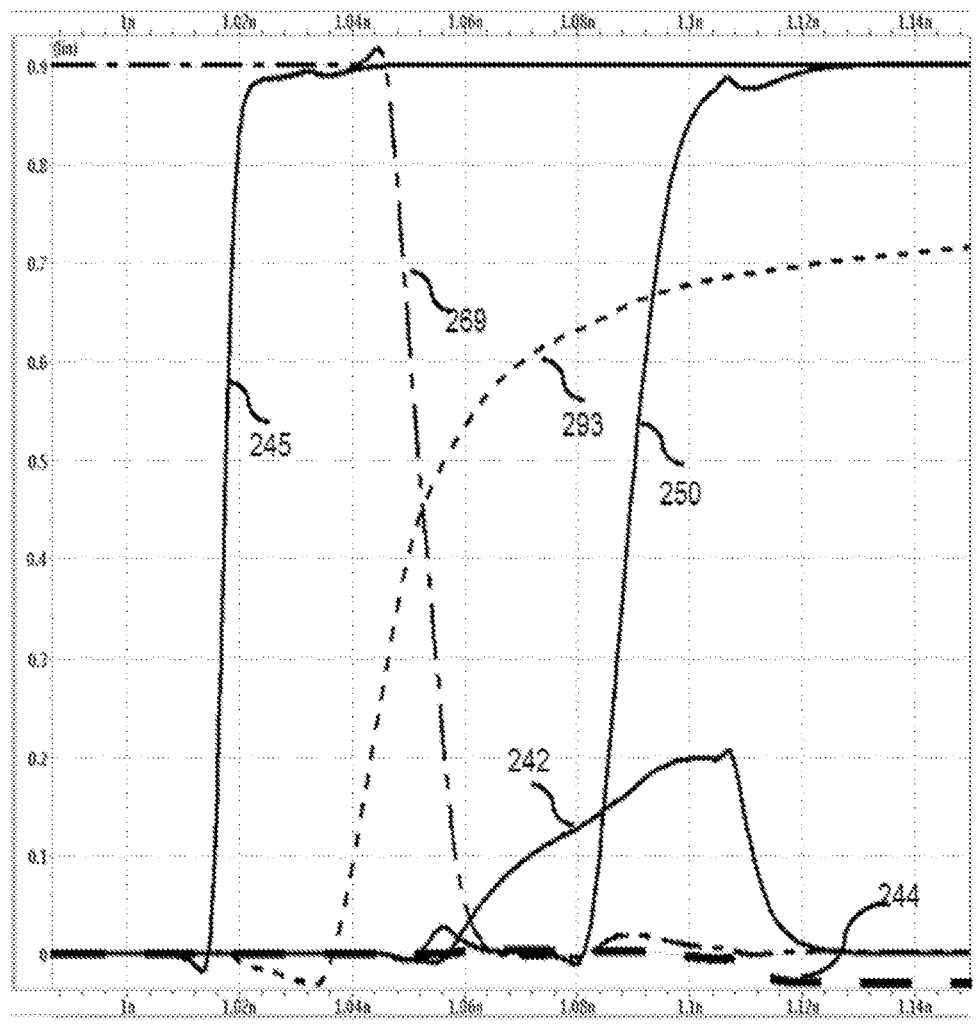
FIG. 3B is an exemplary waveform at high voltage and high temperature using the RA-NBL circuit.

With respect to waveform as shown in FIG. 3B for high voltage and high temperature, node 242 of coupling capacitor 240 is in one embodiment charged to 20% level of supply voltage that generates negative voltage at node 244 that is transferred to bit line. In one embodiment, the coupling capacitor 240 is charged to between 12 mV and 30 mV. In one embodiment, ~−20 mV negative voltage is generated at node 244 of the coupling capacitor 240.

Figure 5A:
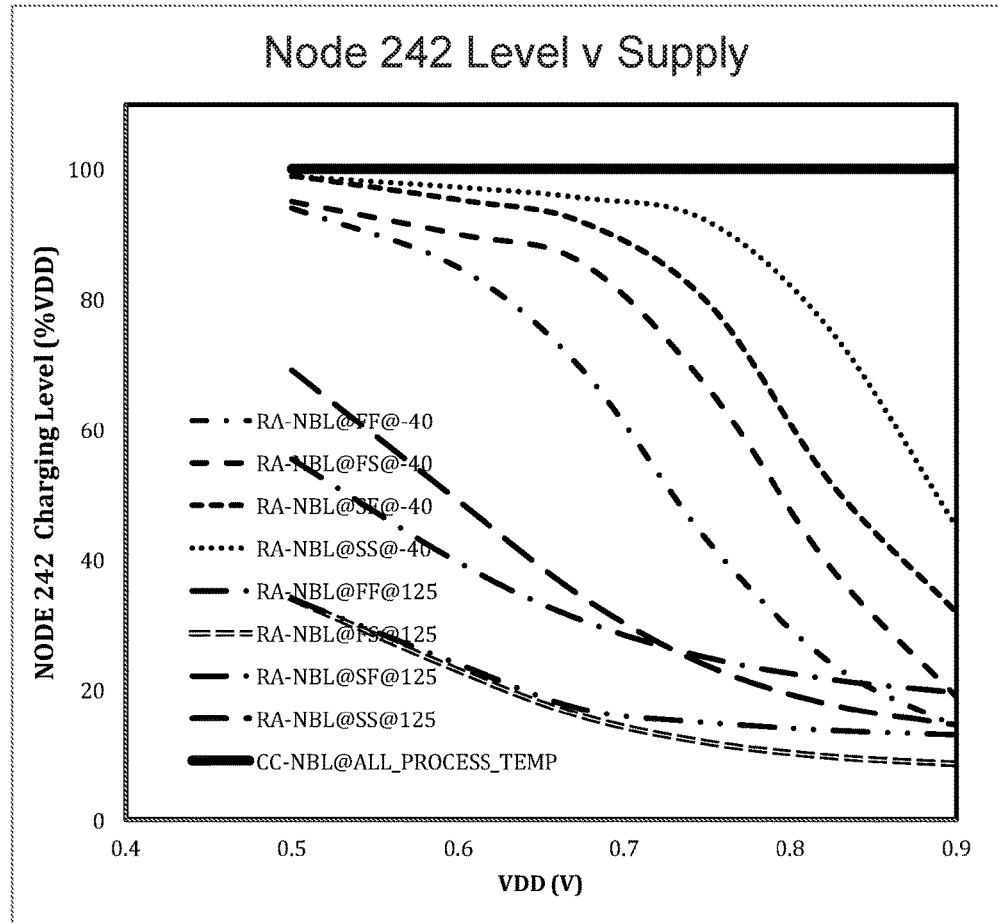
FIG. 5A illustrates embodiments of the charging level across the worst process corner with varying supply voltages at −40 C and 125 C and its statistical variation respectively.

FIG. 5A illustrates exemplary charging levels for coupling capacitor, at various VDD. As shown, in one embodiment, the capacitor is more that 95% of VDD at lower voltage and low temperature at less than 25% of VDD at high temperature and voltage. This lower charging level translates to much lower negative bias generation at higher temperature. This reduces or eliminates the issues of reliability and ageing at high voltage.

Figure 5B:
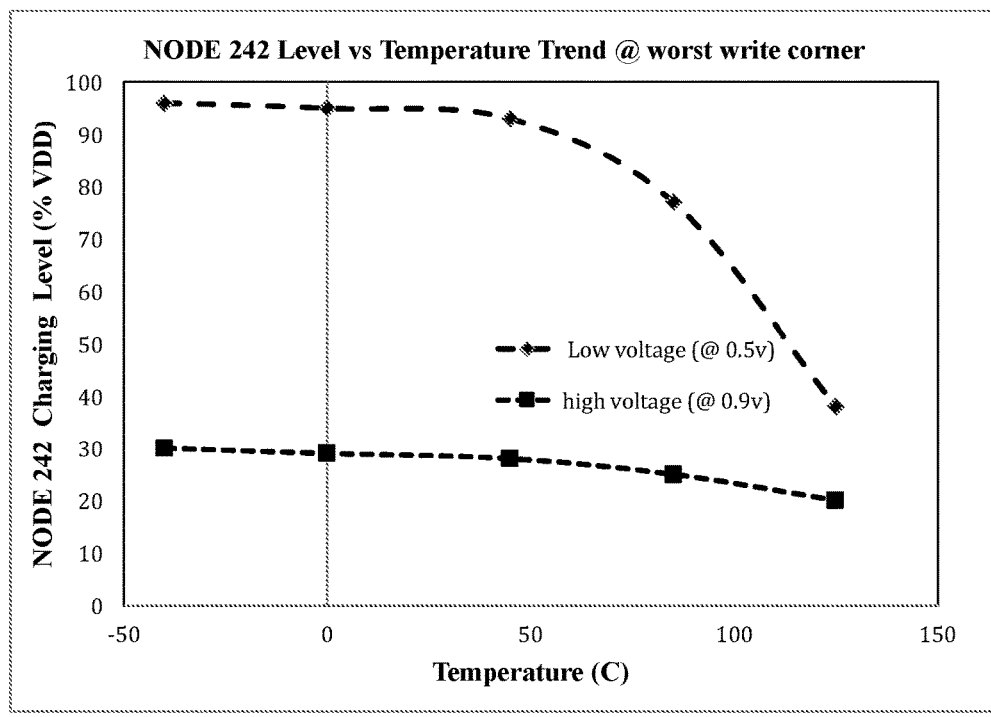
FIG. 5B illustrates embodiments of charging level across temperatures at the worst process corner of a write operation.

FIG. 5B illustrates an exemplary relationship between the temperature and charging level. FIG. 5B illustrates the worst write corner, in one exemplary implementation. At high voltage, there is relatively little temperature dependency in the charging level. Reliability due to overdrive is a major concern at high temperatures, and there is a much lower need for the negative bump for the write assist operation. In one embodiment, as noted above, the temperature sensitivity of gate-drain coupled PMOS device (shown as PMOS device 282 in FIG. 2) and NMOS device (shown as NMOS device 283 in FIG. 2) are used to set this ratio. The exemplary relationship shown here is for the worst write corner.

Thus, the present application discloses a voltage and temperature dependent write assist using a negative bump which may be used to increase the reliability of SRAM. The system reduces the negative bump at higher voltages, and reduces the negative bump at higher temperatures. In one embodiment, by applying a large negative bump at low voltage, without any concern of reliability at higher voltage, the process enables the system to perform a fast write operation. Because there is no concern about the impact of the negative bump at high power, the system may be used to effectively boost power, speed, and performance in low voltage operating zone. It can also improve write performance of memory systems in nominal voltage by providing an assist to write operation.

This technique is useful to provide a write assist in SRAM. However, one of skill in the art would understand that this methodology may be used in any to solve over-drive reliability problems in other systems, where over-drive voltage is generated with the coupling capacitor.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A reliability aware negative bit-line write assist (RA-NBL) circuit for an SRAM (static random access memory) comprising:
   a coupling capacitor to provide a negative voltage bump for write assist;
   a control input generator to selectively charge the coupling capacitor in a voltage and temperature dependent manner, charging the coupling capacitor to a first charging level or a second charging level based on a current operating voltage of the SRAM and a current temperature; and
   a switch to discharge the coupling capacitor to provide the negative voltage bump for the write assist, such that the negative voltage bump is at a first level when the SRAM is operating at a first voltage, and the negative bump is at a second level lower than the first level when the SRAM is operating at a second higher voltage.

2. The RA-NBL circuit of claim 1, wherein at the first voltage the coupling capacitor is fully charged, and at the second higher voltage the coupling capacitor is partially charged.

3. The RA-NBL circuit of claim 1, wherein at a low temperature the coupling capacitor is fully charged, and at a high temperature the coupling capacitor is partially charged.

4. The RA-NBL circuit of claim 1, further comprising:
   a voltage limiting circuit to charge the coupling capacitor.

5. The RA-NBL circuit of claim 4, wherein the voltage limiting circuit comprises a gate-drain connected PMOS circuit and a gate-drain connected NMOS circuit.

6. The RA-NBL circuit of claim 4, further comprising:
   a charging circuit to charge the coupling capacitor, the charging circuit controlled by the voltage limiting circuit.

7. The RA-NBL circuit of claim 6, further comprising:
   a discharging circuit to pull down a charge of the coupling capacitor to Vss.

8. A method of utilizing a reliability aware negative bit-line write assist (RA-NBL) circuit, the method comprising:
   pre-charging a coupling capacitor in a voltage and temperature dependent manner to a first level or a second level determined based on a current Vdd and a current temperature; and
   when writing a memory cell, utilizing the coupling capacitor to provide a negative voltage bump, the negative voltage bump at a first height when the current Vdd is at a first value, and the negative voltage bump is at a second, lower, height when the current Vdd is at a second value higher than the first value.

9. The method of claim 8, wherein when the Vdd is low the coupling capacitor is fully charged, and when the Vdd is high the coupling capacitor is partially charged.

10. The method of claim 8, wherein at a first temperature the coupling capacitor is fully charged, and at a second temperature, higher than the first temperature, the coupling capacitor is partially charged.

11. The method of claim 8,
   wherein charging the coupling capacitor in the voltage and temperature dependent manner through a voltage limiting circuit further comprises charging the coupling capacitor in a voltage and temperature dependent manner through a voltage limiting circuit using a gate-drain connected PMOS circuit and a gate-drain connected NMOS circuit.

12. The method of claim 8, further comprising:
   pulling down a charge of the coupling capacitor to Vss, though a discharging circuit.

13. A system comprising:
   an SRAM cell;
   a write driver coupled to the SRAM cell;
   a coupling capacitor coupled to the write driver, the coupling capacitor to provide a negative voltage bump to the write driver; and
   a charging circuit to pre-charge the coupling capacitor in a voltage and temperature dependent manner, charging the coupling capacitor to a first pre-charge level based on a current temperature and when the Vdd is at a first value, and to a second pre-charge level below the first level based on the current temperature and when the Vdd is at a second value higher than the first value, such that during a write operation, the coupling capacitor discharges to provide the negative voltage bump of the first level or the second level.

14. The system of claim 13, wherein the first level is fully charging the coupling capacitor, and at the second level is partially charged.

15. The system of claim 13, further comprising:
   the charging circuit to charge the coupling capacitor to a higher level when a temperature is lower than when the temperature is higher.

16. The system of claim 13, further comprising:
   a voltage limiting circuit to charge the coupling capacitor, the voltage limiting circuit comprising a gate-drain connected PMOS circuit and a gate-drain connected NMOS circuit.

17. The system of claim 16, further comprising:
   a charging circuit to charge the coupling capacitor, the charging circuit controlled by the voltage limiting circuit.

18. The system of claim 13, further comprising:
   a discharging circuit to pull down a charge of the coupling capacitor to Vss.

19. The system of claim 13, comprising:
   a voltage limiting circuit comprising a gate-drain coupled MOS element, the gate-drain coupled MOS element being sensitive to temperature and voltage level, to limit the charging voltage of the capacitor based on the temperature level.

20. The system of claim 13, wherein the write driver is coupled to a plurality of SRAM cells, and used to provide the negative bump to the plurality of SRAM cells.

* * * * *